US006157020A

United States Patent [19]
Krapf et al.

[11] Patent Number: 6,157,020
[45] Date of Patent: Dec. 5, 2000

[54] BISPECTRAL ELECTROMAGNETIC WAVE DETECTOR

[75] Inventors: Pascal Krapf, Forbach; Eric Costard, Massy; Philippe Bois, Cesson, all of France

[73] Assignee: Thomson-CSF, Paris, France

[21] Appl. No.: 08/984,950

[22] Filed: Dec. 4, 1997

[30] Foreign Application Priority Data

Dec. 4, 1996 [FR] France ................................ 96 14852

[51] Int. Cl.⁷ .................................................. H01J 40/14
[52] U.S. Cl. .............................. 250/214 LA; 250/339.01; 257/440
[58] Field of Search ................. 250/214 LA, 339.01, 250/339.02, 214.1, 338.4; 257/440, 21

[56] References Cited

U.S. PATENT DOCUMENTS

| | | | |
|---|---|---|---|
| 5,059,786 | 10/1991 | Chu | 250/338.4 |
| 5,086,327 | 2/1992 | Rosencher et al. | |
| 5,113,076 | 5/1992 | Schulte | 250/370.06 |
| 5,144,397 | 9/1992 | Tokuda et al. | 257/656 |
| 5,149,956 | 9/1992 | Norton | 257/188 |
| 5,187,715 | 2/1993 | Weisbuch et al. | |
| 5,228,777 | 7/1993 | Rosencher et al. | |
| 5,326,984 | 7/1994 | Rosencher et al. | |
| 5,457,331 | 10/1995 | Kosai et al. | 257/188 |
| 5,479,032 | 12/1995 | Forrest et al. | 257/190 |
| 5,506,418 | 4/1996 | Bois et al. | |
| 5,552,603 | 9/1996 | Stokes . | |
| 5,581,084 | 12/1996 | Chapman et al. | 250/338.4 |
| 5,646,421 | 7/1997 | Liu | 257/21 |
| 5,677,544 | 10/1997 | Duboz et al. | |
| 5,712,499 | 1/1998 | Duboz et al. | |
| 5,719,670 | 2/1998 | Duboz et al. | |
| 5,726,500 | 3/1998 | Duboz et al. | |
| 5,731,621 | 3/1998 | Kosai | 257/440 |

FOREIGN PATENT DOCUMENTS

| | | |
|---|---|---|
| 0 345 972 | 12/1989 | European Pat. Off. . |
| 0 481 552 | 4/1992 | European Pat. Off. . |
| 2 693 594 | 1/1994 | France . |

*Primary Examiner*—Que T. Le
*Assistant Examiner*—Thanh X. Luu
*Attorney, Agent, or Firm*—Oblon, Spivak, McClelland, Maier & Neustadt, P.C.

[57] ABSTRACT

The disclosure relates to a bispectral electromagnetic wave detector including at least one first and one second overlaid plane active detector elements separated by a common layer, said first and second detector elements being sensitive to the different wavelengths; a first means of connection connected in common to said first and second detector elements, a second means of connection connected to said first detector element, and a third means of connection connected to said second detector element; means for applying successively a control voltage to each means of connection; and means connected to said first means of connection to detect a photoconduction current each time a control voltage is applied. The invention is used in applications requiring detection of electromagnetic waves in two bands of different wavelengths.

4 Claims, 7 Drawing Sheets

BISPECTRAL ELECTROMAGNETIC WAVE DETECTOR

BACKGROUND OF THE INVENTION

The invention relates to an electromagnetic wave detector, notably a bispectral photoconductor-based detector.

The invention is advantageously applicable in the fabrication of a bispectral detection matrix.

DESCRIPTION OF THE PRIOR ART

Detection systems that detect radiation in two spectral bands are used in applications such as the identification or recognition of objects. Measurement of the thermal emission of an object in two spectral bands enables its temperature or its distance from the observer to be deduced, which represent additional information compared with that provided by a monospectral image. An example of a quantum-well detector that can detect two wavelengths is described in the French patent application n°92 08384.

Integrated two-band detectors provide information from both bands for each pixel in a focal plane, thus reducing the weight, electrical power and cost of the complete system. Moreover, the integration of such detectors in the same focal plane requires no optical alignment.

SUMMARY OF THE INVENTION

According to the invention, an integrated two-band detector is composed of two active layers and three layers for the electrical contacts (FIG. 1) superimposed on a substrate. The signal of the active layer D1 is collected between the contacts C1 and Cc and the signal of the active layer D2 is collected between C2 and Cc. However, hybridization techniques do not enable two independent contacts for each active layer on small pixels. The invention proposes a connection configuration for such detectors that provides for two sequential signals with a single contact for addressing the pixels.

The invention therefore relates to a photoconductor-based electromagnetic wave detector including:

- at least one first and one second overlaid plane active detector elements separated by a common layer, said first and second detector elements being sensitive to the different wavelengths;
- a first means of connection connected in common to said first and second detector elements, a second means of connection connected to said first detector element, and a third means of connection connected to said second detector element;
- means for applying control voltages successively to each means of connection;
- means connected to said first means of connection to detect a photoconduction current each time a control voltage is applied.

BRIEF DESCRIPTION OF THE DRAWINGS

Other characteristics and advantages of the present invention will become apparent on read the following description of a preferred embodiment, with reference to the attached drawings.

DESCRIPTION OF THE PREFERRED EMBODIMENT

Figure 1:
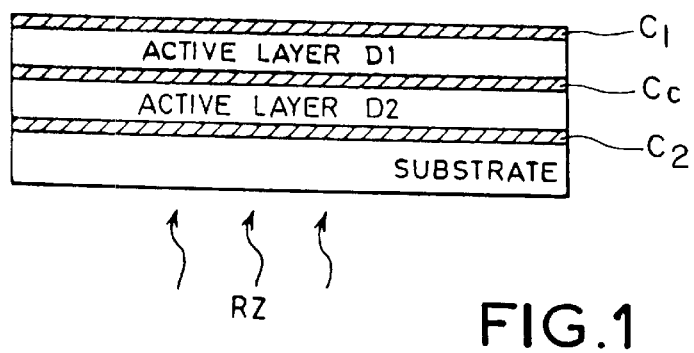
FIG. 1 shows two superimposed detectors.

As shown in the simplified diagram in FIG. 1, the detector according to the invention includes, overlaid on a substrate:

a contact layer C2, an active photoconducting layer D2, a common contact layer Cc, an active photoconducting layer D1, a contact layer C1.

The active photoconducting layers D1, D2 can be layers of photoconducting material. They can also be made in the form of stacks of layers constituting quantum-well detectors. The two active layers D1, D2 have different characteristics such that they become photoconducting when irradiated with electromagnetic waves of different wavelength (or bands of wavelength). The active layers D1, D2 becomes photoconducting when subjected to radiation of respective wavelengths $\lambda 1$ and $\lambda 2$. The detector receiving radiation RZ as shown in FIG. 1, the active layer D2 is transparent at wavelength $\lambda 1$.

The contact layers C1 and C2 enable control voltages to be applied. The contact layer Cc is common to the two detector elements comprised of active photoconducting layers. It is held at a reference voltage and enables detection of the photocurrents generated by the detectors D1, D2.

Figure 2A:
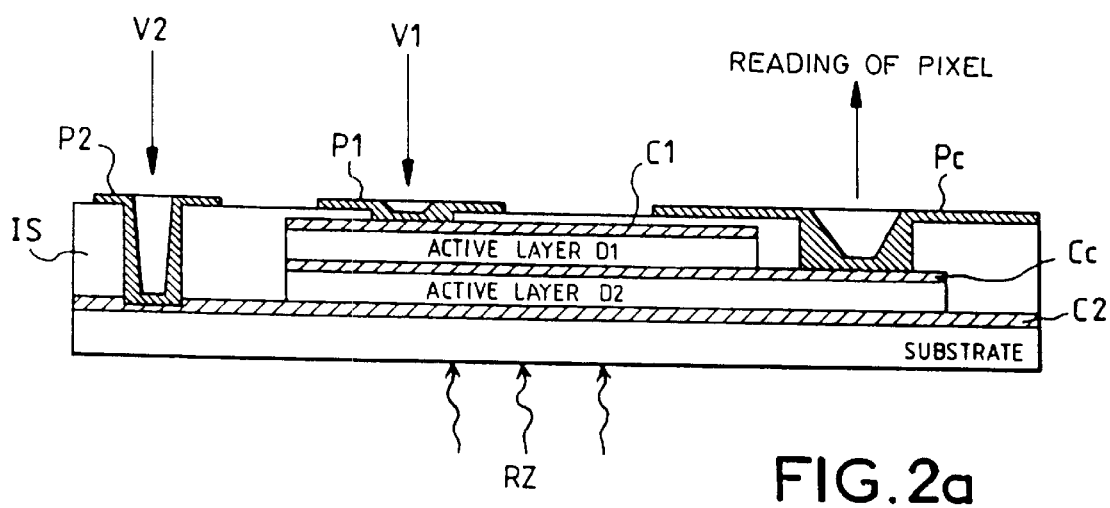
FIGS. 2a to 2d show a set of two detectors with associated electrical connection elements.

FIG. 2a shows a more detailed embodiment of the detector according to the invention in which the detector is encapsulated in an insulating material IS. The connection terminals P1, P2, Pc traverse this insulator and enable contacts to be made on the contact layers C1, C2, Cc respectively.

The substrate is transparent to the wavelengths to be measured, so the detector receives the radiation RZ to be detected through the substrate.

Figure 2B:
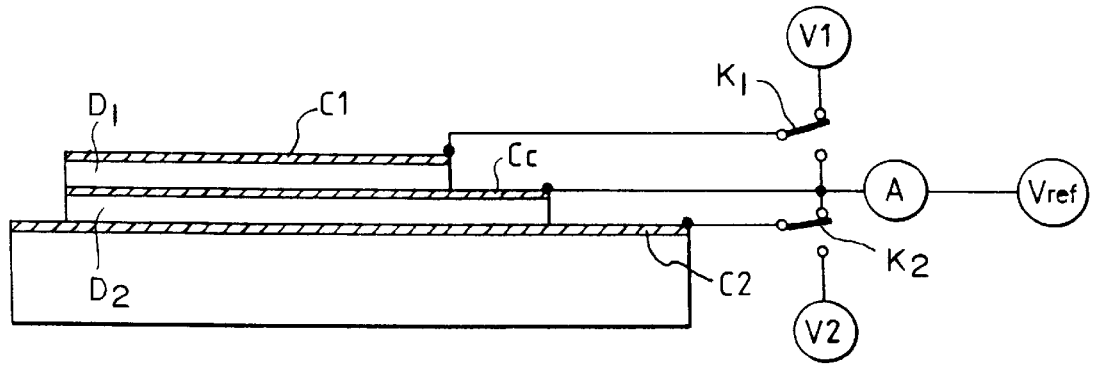

When the radiation RZ is received by the detector, to detect two wavelengths $\lambda 1$, $\lambda 2$ or bands of wavelengths, a reference voltage Vref is applied to the connection terminal Pc, in other words to the common contact layer Cc (see FIG. 2b). This reference voltage can be a ground, for example. Next, we first apply a voltage V1 to the contact layer C1 (terminal P1) and the reference voltage Vref to the contact layer C2 (terminal P2).

The detector element D2 is rendered inactive, the detector element D1 is active and generates a photocurrent i1. If the radiation RZ contains a wavelength $\lambda 1$, the device A detects this current i1. This operation corresponds to the position of the switches K1 and K2 in FIG. 2b.

Figure 2C:
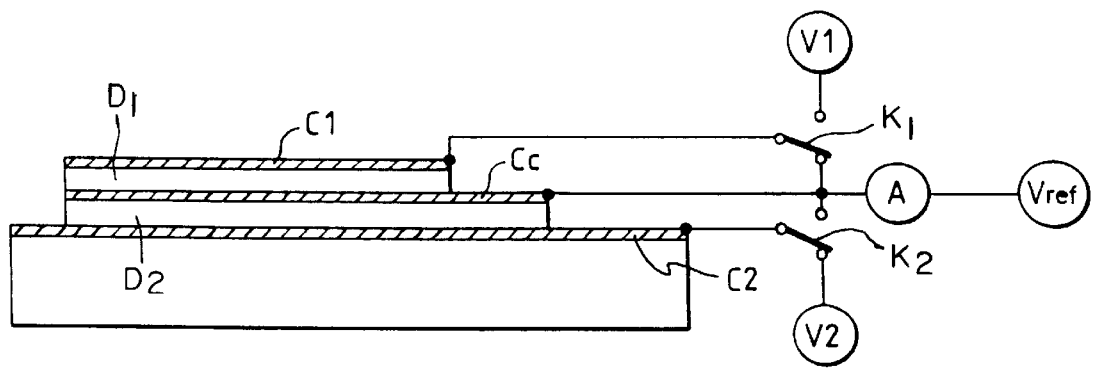

Secondly, the switches K1, K2 are set to the positions shown in FIG. 2c. A voltage V2 is applied to the contact layer C2. The reference voltage Vref is applied to the contact layer C1. The detector element D1 is then inactive, whereas the detector element D2 is made active and generates a photocurrent i2 on reception of a wavelength $\lambda 2$. The device A measures this photocurrent.

The device according to the invention thereby enables the successive detection of wavelengths $\lambda 1$ and $\lambda 2$.

Figure 2D:
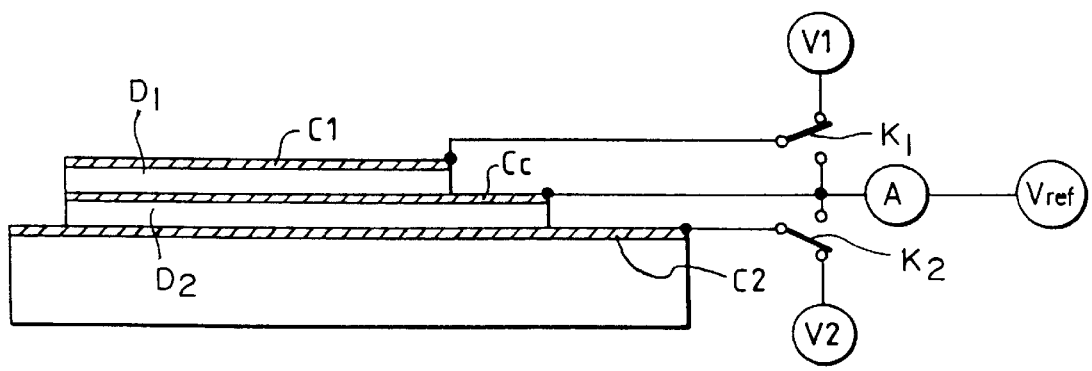

FIG. 2d represents the operation of the device when both detector elements D1 and D2 are active. The switches K1 and K2 respectively apply the voltage V1 and V2 to them. These potentials have the same sign relative to the reference voltage Vref such that, in the presence of wavelengths $\lambda 1$ and $\lambda 2$, the two detector elements D1 and D2 generate photocurrents in the same direction in the device A which therefore measures the sum of the generated photocurrents. The signal measured therefore corresponds to the sum of the signals in the two spectral bands.

As an example, the control voltage could be 2 Volts for V1 and 4 Volts for V2.

Figure 3A:
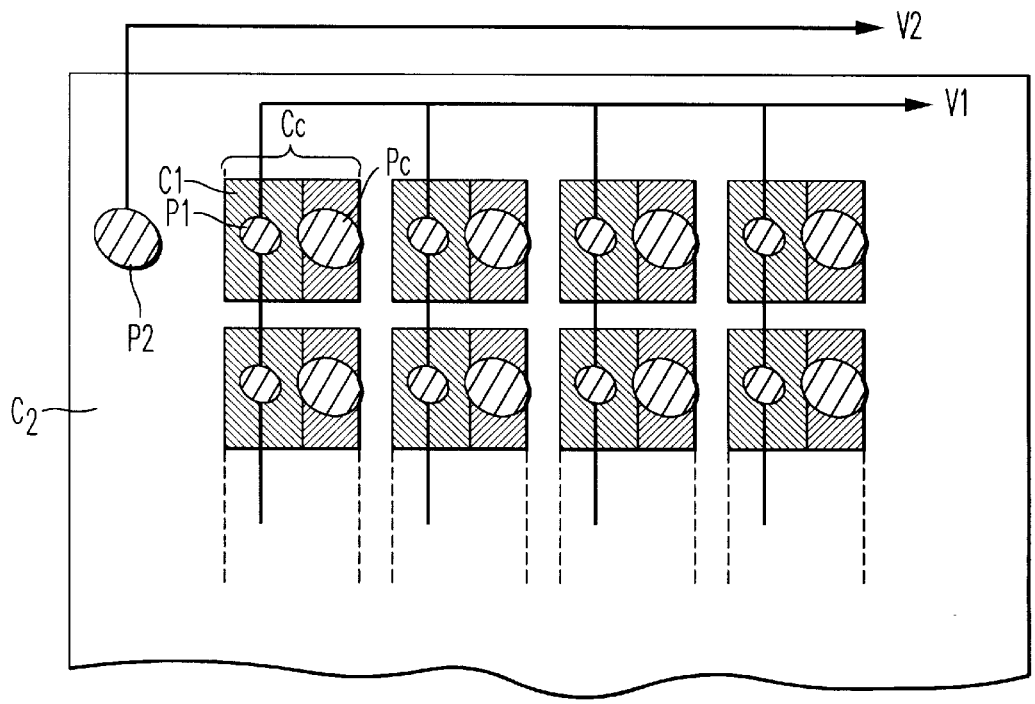
FIGS. 3a and 3b show a plan view and a sectional view of a matrix of bispectral detectors.
Figure 3B:
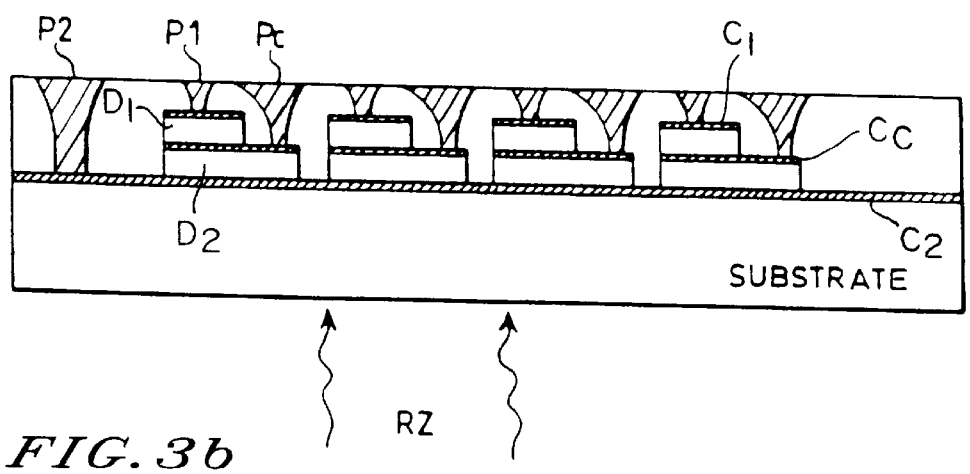

FIGS. 3a and 3b show a plan view and a sectional view of a matricial embodiment of a bispectral detector according to the invention.

The detectors of the matrix are made on a control contact layer C2 common to all the detectors. The connection terminal P2 is therefore common to the whole matrix. Each detector includes a detector element D1, a detector element D2, the contact layers C1 and Cc and the connection terminals P1 and Pc. The connection terminals P1 are all connected together to apply a voltage V1 or Vref (see earlier) to all the detector elements D1 of the matrix. The contact layer C2 and the connection terminal P2 being common to the whole matrix, the potential applied to the terminal P2 is applied to all the detector elements D2 of the matrix.

To enable reading of the detectors of the matrix, each detector is located at the intersection of a network of line and column conductors. In FIG. 3c, we have shown only the connection terminal Pc of each detector. Each intersection is equipped with, for example, a transistor Tr whose base is connected to the line wire. The emitter and the collector are connected respectively to a terminal Pc and a column wire. By applying a suitable potential to a line wire we can control all the transistors of the line and connect all the terminals Pc of a line to column wires. It is therefore possible to read on each column wire the photocurrent generated by the detector connected to this column wire.

In this embodiment, all the terminals P1 are interconnected and set to the same potential. The same applies to the contact layer C2 that is common to all the detectors and connected to the terminal P2.

In a variant of the embodiment, the control contact layer C2 is cut into strips such that each strip is common to a line of detectors. We then have one terminal P2 per contact strip C2, i.e. per line of detectors.

In a similar manner, instead of interconnecting all the terminals P1, we can interconnect them in lines of detectors, in which case we have one terminal P1 per line of detectors.

The terminals Pc of the detectors are interconnected by column wires of the matrix. The operation of the matrix of detectors is then sequential by line. During each detection operation of a line, we apply the voltage V1 to the terminal P1 of this line and the voltage Vref to the terminal P2, then the voltage V2 to the terminal P2 and the voltage Vref to the terminal P1. The reading is taken on the column wires; each column wire enables reading of one detector of the controlled line.

During each control of a line, the operation of the detectors of the other lines can be inhibited by applying a voltage Vref to the terminals P1 and P2 of these lines.

Owing to the bispectral operation of the detectors (see the description relating to FIGS. 2b and 2c) during each detection operation on a line, we will have a reading time of the detector elements D1 (operation corresponding to FIG. 2b) followed by a reading time of the detector elements D2 (operation corresponding to FIG. 2c).

Figure 4A:
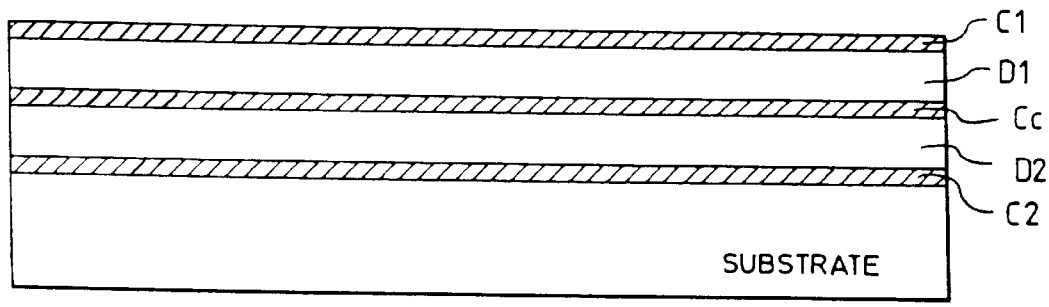
FIGS. 4a to 4c show example of a method of fabrication of the device according to the invention.
Figure 4B:
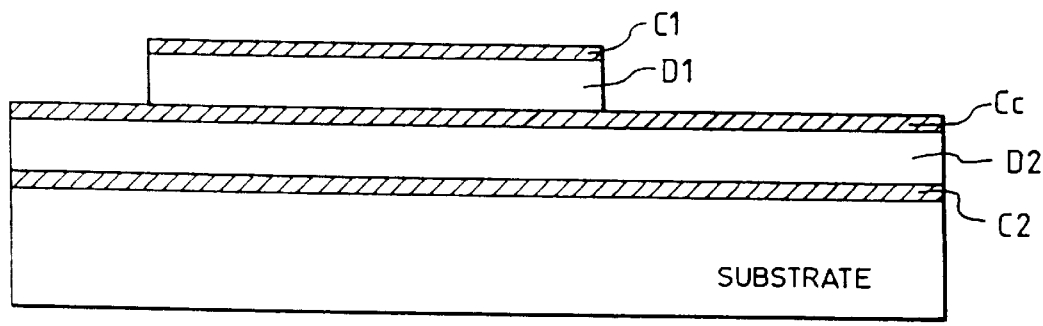
Figure 4C:
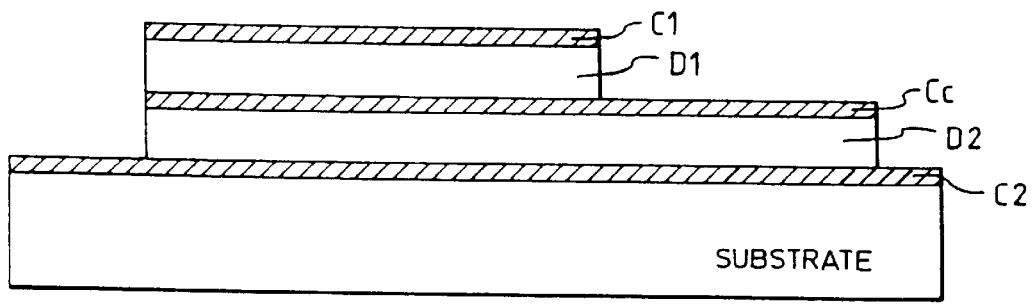

We shall now describe a method of fabrication of a detector according to the invention, with reference to FIGS. 4a to 4c.

On a substrate of material transparent to the wavelengths to be detected, we successively make a contact layer C2, one or more photoconducting layers D2 constituting the photodetector element D2, a common contact layer Cc, one or more photoconducting layers D1 constituting the photodetector element D1, and a contact layer C1 (FIG. 4a).

The upper detector element D1 is formed by engraving or ionic implantation of the layers C1 and D1; the engraving (or implantation) stops at the contact layer Cc (FIG. 4b).

The lower detector element D2 is then formed by engraving or ionic implantation of the layers Cc and D2; the engraving (or implantation) stops at the contact layer C2 (FIG. 4c).

The whole structure is then covered with a layer of insulator IS (FIG. 2).

Next, three holes are made in the layer of insulator to access the three contact layers; metal deposits are made in these holes to form the contact terminals P1, P2 and Pc.

For the fabrication of a matrix of detectors, the various detectors are made collectively as described previously. We then obtain a structure such that shown in FIG. 3b. As we have seen, the terminal P2 is common to the whole matrix. All that remains is therefore to make on the surface of the matrix the interconnecting conductors of the terminals P1, then the matrix of terminals Pc.

We have described above the invention making use of vertical transport detectors such as multi-quantum well detectors. We shall now describe the invention with horizontal transport detectors.

Figure 5:
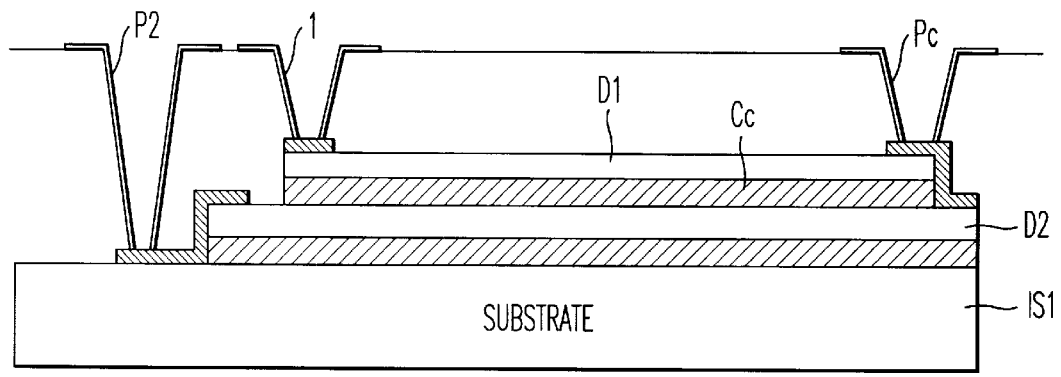
FIGS. 5 to 9 illustrate variants of the invention.

The detector is composed of two active layers separated by an insulating layer Cc (see FIG. 5).

Ohmic contacts are made at the two ends of each active layer D1, D2. At one of the ends of the detector, the ohmic contacts are made common to define the reading contact Pc. This contact Pc (one contact per pixel) will assure the connection with the input stage of the reading circuit. The lower contact P2 is connected to the active layer D2; the upper contact P1 is connected to the active layer D1. We therefore see that when the active layers are suitably polarized the detector operates in a similar manner to the one described previously, with the difference that the current circulates in the plane of the active layers instead of perpendicularly to the plane of the active layers.

In FIG. 5, an insulating layer IS1 is inserted between the active layer D2 and the substrate.

Figure 6:
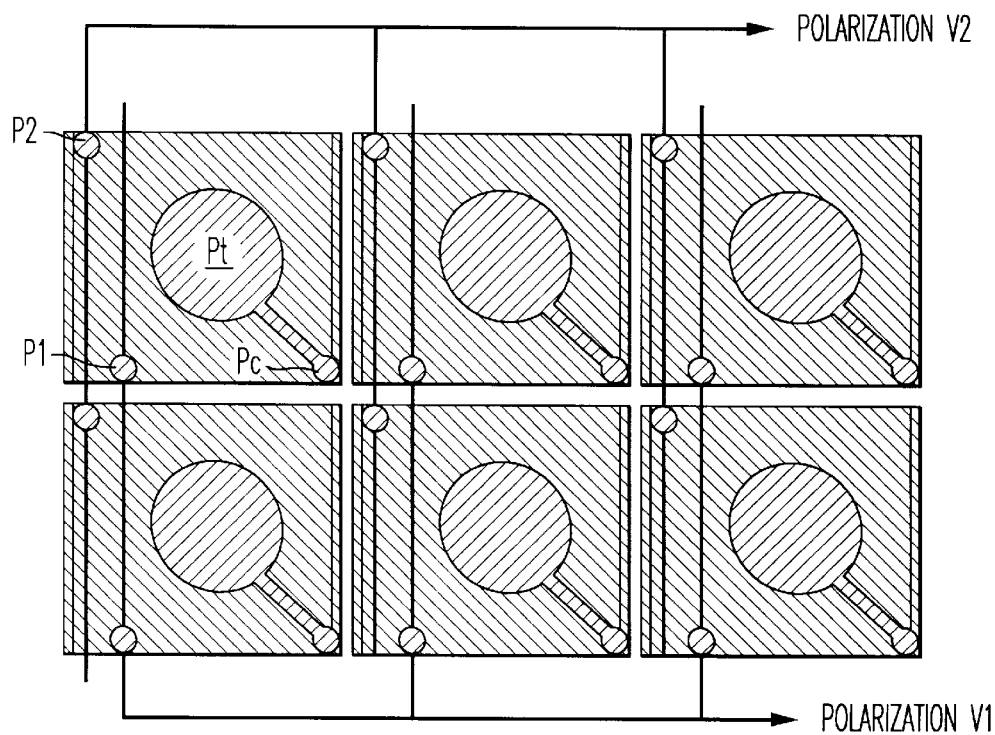

FIG. 6 shows a matrix organization of detectors such as those in FIG. 5. In this organization all the contacts P1 are connected to each other by column wires. The same applies for the contacts P2 and Pc. One central test terminal Pt per detector can be used to perform a current test.

Figure 7:
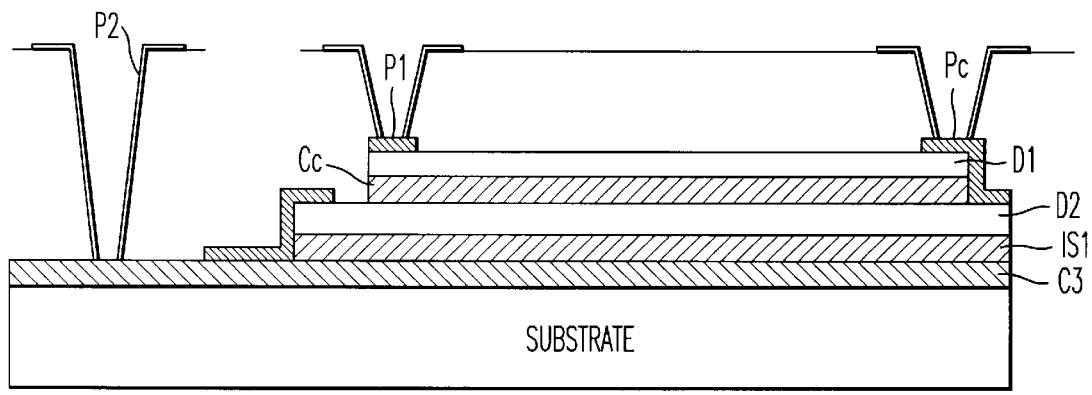

FIG. 7 shows a variant of the embodiment in FIG. 5 including a conducting layer C3 placed on the substrate and on which the structure in FIG. 5 is formed.

Figure 8:
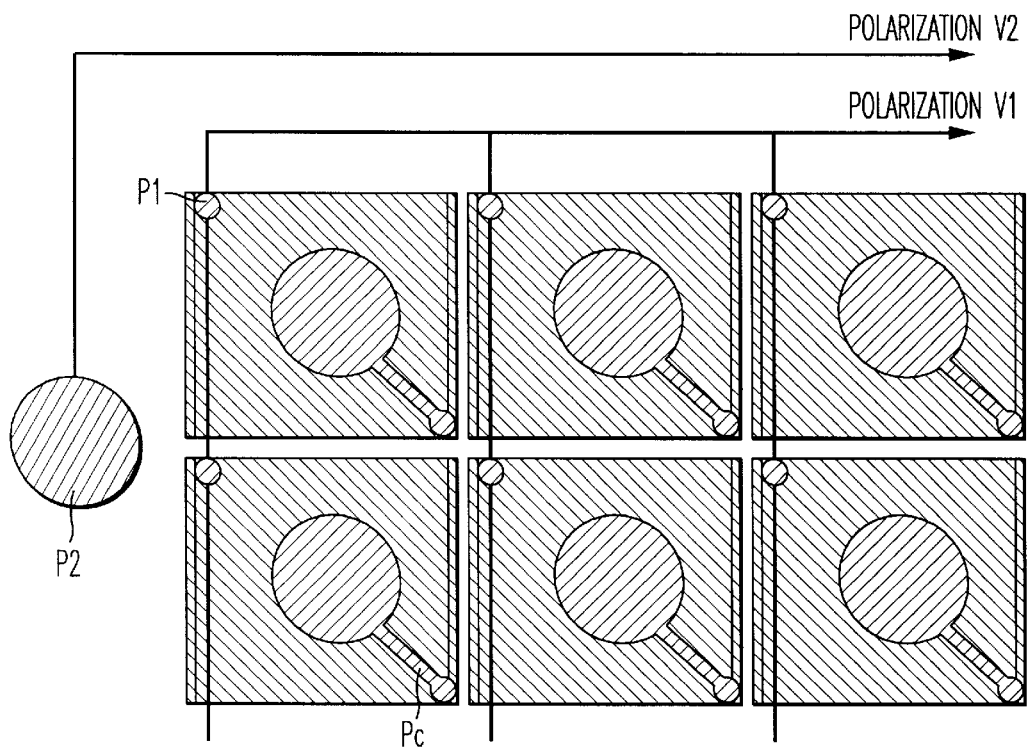

FIG. 8 shows a matrix organization of detectors of FIG. 7. In this matrix organization, the layer C3 enables a single terminal connection P2 to be used that is common to all the detector pixels.

Figure 9:
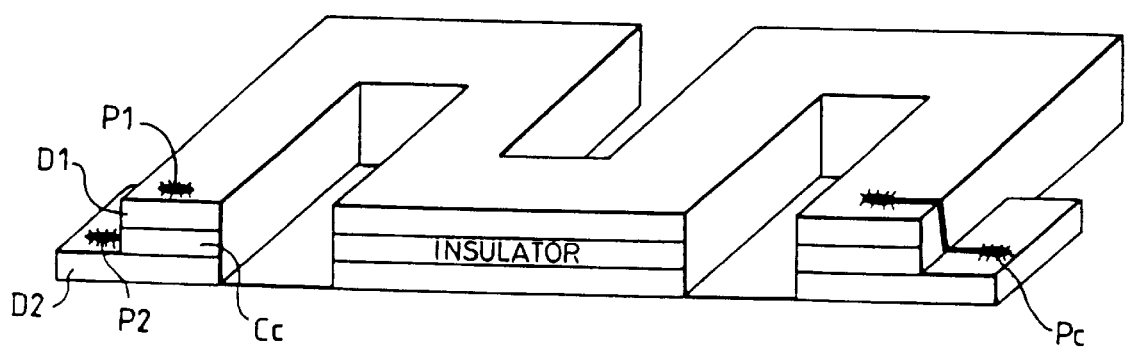

It will be clear to professionals of the art that there are additional possibilities of improvement while remaining within the framework of the invention:
   inclusion of diffraction networks engraved on the top of the detector to minimize the thickness of the active layer and increase the detection sensitivity of the device; they also enable the responses of the two stages to be desymmetrized;
   use of a "serpentine" geometry (see FIG. 9) which increases the resistance of the pixel (by increasing the developed length and decreasing the equivalent electric surface without substantially changing the optical area); this geometry also provides some flexibility as regards metallurgical defects, since these then cause only local short-circuits.

What is claimed is:

1. Photoconductor-based electromagnetic wave detector including:

at least one first and one second overlaid plane active detector elements separated by a common layer, said first and second detector elements being sensitive to the different wavelengths;

a first means of connection connected in common to said first and second detector elements, a second means of connection connected to said first detector element, and a third means of connection connected to said second detector element;

means for applying control voltages successively to each means of connection;

means connected to said first means of connection to detect a photoconduction current each time a control voltage is applied, wherein said common layer is an insulating layer, said first means of connection is connected to a first end of each detector element, and said second and third means of connection are each connected to a second end of a detector element, said first and second ends of each detector element being opposite ends of the detector element.

2. Detector including a matrix of detectors according to claim 1, made on a substrate, a conducting layer common to all the detectors being made on the face of the substrate, this layer being covered by an insulating layer, each detector including, on this insulating layer, a first detector element of photoconducting material, a common insulating layer, a second detector element of photoconducting material, said second means of connection all being interconnected and said third means of connection all being interconnected.

3. Photoconductor-based electromagnetic wave detector including:

at least one first and one second overlaid plane active detector elements separated by a common layer, said first and second detector elements being sensitive to the different wavelengths;

a first means of connection connected in common to said first and second detector elements, a second means of connection connected to said first detector element, and a third means of connection connected to said second detector element;

means for applying control voltages successively to each means of connection;

means connected to said first means of connection to detect a photoconduction current each time a control voltage is applied wherein said common layer is an electrical contact layer to which said first means of connection is connected, and said first and second detector elements are enclosed between two electric control contact layers, said second and third means of connection each being connected to one of said control contact layers wherein said detector includes a matrix of detectors made on a substrate, a first control contact layer being made on the face of the substrate and being common to a set of detectors, each detector including, on said first control contact layer, a first detector element of photoconducting material, a contact layer for reading, second detector element of photoconducting material, and a second control contact layer which is connected to a respective second control contact layer of all the other detectors of the matrix and wherein said first control contact layer is made of in the form of strips, a row of detectors being made on each strip and said second contact layers of the detector of each row of detectors are interconnected and wherein said reading contact layers of a detector of each row of detectors are interconnected to form columns of detectors.

4. Detector according to claim 3, including a matrix of line conductors and column conductors superposed on said matrix of detectors, each detector being located substantially at an intersection of the matrix of line conductors and column conductors and being connectable to the column wire at the intersection via a switching device that can be controlled by a voltage applied to the line wire at the intersection.

* * * * *